United States Patent
Suda

(10) Patent No.: US 8,441,296 B2
(45) Date of Patent: May 14, 2013

(54) TIMING GENERATOR AND TEST APPARATUS

(75) Inventor: Masakatsu Suda, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 13/253,972

(22) Filed: Oct. 6, 2011

(65) Prior Publication Data
US 2012/0262215 A1 Oct. 18, 2012

Related U.S. Application Data

(63) Continuation of application No. PCT/JP2009/002842, filed on Jun. 22, 2009.

(51) Int. Cl.
*G06F 1/04* (2006.01)
(52) U.S. Cl.
USPC ............ 327/295; 327/141; 327/161; 327/299
(58) Field of Classification Search .................. 327/299, 327/298, 165, 291, 293, 261, 284, 269, 271, 327/272, 276, 277, 278, 294, 295, 296, 141, 327/161
See application file for complete search history.

(56) References Cited

U.S. PATENT DOCUMENTS

| | | | | |
|---|---|---|---|---|
| 5,465,066 A | * | 11/1995 | Yamashita et al. | 327/294 |
| 5,710,744 A | * | 1/1998 | Suda | 368/120 |
| 6,388,492 B2 | * | 5/2002 | Miura et al. | 327/291 |
| 7,203,611 B2 | * | 4/2007 | Doi | 702/69 |

FOREIGN PATENT DOCUMENTS
JP H08-320360 A 12/1996

* cited by examiner

*Primary Examiner* — Long Nguyen
*Assistant Examiner* — Thomas Skibinski
(74) *Attorney, Agent, or Firm* — Ryuka

(57) ABSTRACT

A timing generator that outputs a timing signal obtained by delaying an input signal, comprising first and second period delay sections that each output a rate signal obtained by delaying the input signal by a delay amount corresponding to an integer multiple of a period of an operation clock supplied thereto; a first high-accuracy delay section that outputs the timing signal obtained by delaying a signal input thereto by a delay amount that is less than the period of the operation clock; and a mode switching section that switches between a low-speed mode, in which the rate signal output by the first period delay section is input to the first high-accuracy delay section, and a high-speed mode, in which a signal obtained by interleaving the rate signals output by the first period delay section and the second period delay section is input to the first high-accuracy delay section.

13 Claims, 12 Drawing Sheets

TIMING GENERATOR AND TEST APPARATUS

BACKGROUND

1. Technical Field

The present invention relates to a timing generator and a test apparatus.

2. Related Art

A timing generator is known that adjusts pulse timings to generate a timing signal having pulses at prescribed phases, as shown in Patent Document 1, for example. The phase of each pulse in the timing signal can be adjusted over a wide range with a high degree of accuracy by using a combination of a wide-range delay section that delays each pulse of the input signal by an integer multiple of the period of a reference clock and a high-accuracy delay section that delays each pulse by an amount no greater than the period of the reference clock.

Patent Document 1: Japanese Patent Application Publication H08-320360

In order to generate a timing signal with a higher frequency, two timing signals with different pulse timings can be combined. For example, by combining a first timing signal in which the pulse timings are T, 3T, 5T, etc. and a second timing signal in which the pulse timings are 2T, 4T, 6T, etc., a high-frequency timing signal in which the pulse timings are T, 2T, 3T, 4T, etc. can be generated.

However, each timing signal is generated by a different timing generator. The wide-range delay section in each timing generator can cause the same delay by using the same reference clock in each timing generator. However, each high-accuracy delay section independently generates the delay amount according to a setting value supplied thereto, and therefore a delay error occurs between the timing generators due to element variation, for example.

For example, when there is an error of ΔT in the delay of the second timing signal, the pulse timings of the resulting combined timing signal become T, 2T+ΔT, 3T, 4T+ΔT, etc. In this case, the jitter is applied to this timing signal.

SUMMARY

Therefore, it is an object of an aspect of the innovations herein to provide a timing generator and a test apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a timing generator that outputs a timing signal obtained by delaying an input signal, comprising a first period delay section and a second period delay section that each output a rate signal obtained by delaying the input signal by a delay amount corresponding to an integer multiple of a period of an operation clock supplied thereto; a first high-accuracy delay section that outputs the timing signal obtained by delaying a signal input thereto by a delay amount that is less than the period of the operation clock; and a mode switching section that switches between a low-speed mode, in which the rate signal output by the first period delay section is input to the first high-accuracy delay section, and a high-speed mode, in which a signal obtained by interleaving the rate signal output by the first period delay section and the rate signal output by the second period delay section is input to the first high-accuracy delay section. Also provided is a test apparatus using the timing generator.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
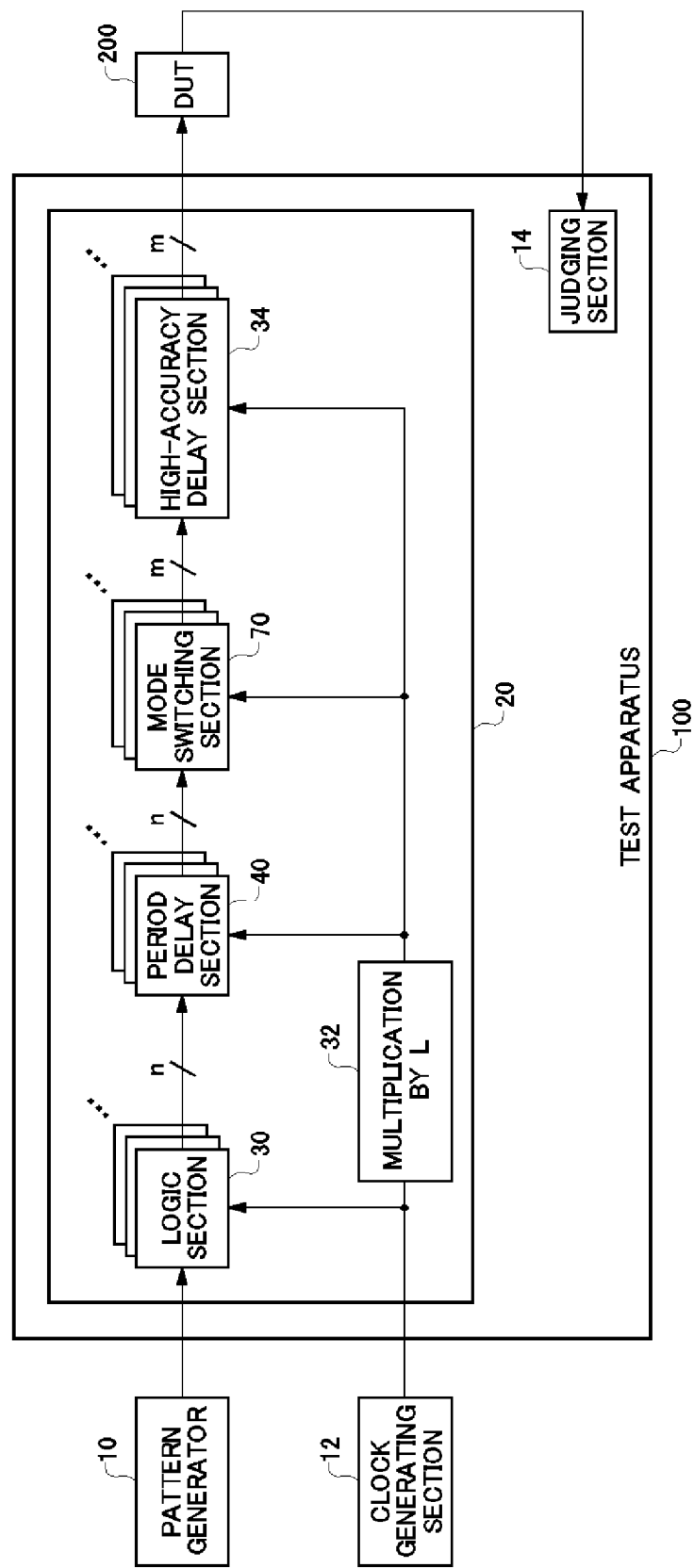
FIG. 1 shows a configuration of a test apparatus 100 according to an embodiment of the present invention, along with a device under test 200.

FIG. 1 shows a configuration of a test apparatus 100 according to an embodiment of the present invention, along with a device under test 200. The test apparatus 100 tests the device under test 200 by applying a prescribed test signal to the device under test 200, which may be a semiconductor circuit, for example. The test apparatus 100 of the present embodiment switches the frequency of the test signal by switching among operational modes.

The test apparatus 100 includes a pattern generator 10, a clock generating section 12, a timing generator 20, and a judging section 14. The pattern generator 10 generates a test pattern. The test pattern includes a logic pattern of the test signal to be applied to the device under test 200.

For example, the test pattern may sequentially indicate, for each test cycle, whether a pulse is to be input to each pin of the device under test 200. The pattern generator 10 also generates setting data that indicates which phase in each test cycle each pulse to be input to the device under test 200 is arranged in. The pattern generator 10 can generate the prescribed test signal by determining whether a pulse is removed from each test cycle of a rate signal having the same period as the test cycle, according to the test pattern, and delay the pulses of the rate signal in each test cycle according to the setting data, for example.

The clock generating section 12 generates a reference clock having a prescribed frequency. The timing generator 20 outputs a timing signal obtained by delaying the input signal. The timing generator 20 of the present embodiment receives, as the input signal, the rate signal corresponding to the test pattern generated by the pattern generator 10, and delays each pulse of the input signal according to the setting data. In this way, the timing generator 20 can apply the prescribed logic pattern to the device under test 200 at a predetermined timing.

The timing generator 20 includes logic sections 30, a frequency multiplier 32, period delay sections 40, high-accuracy delay sections 34, and mode switching sections 70. The logic sections 30 receive the test pattern and the setting data from the pattern generator 10. Each logic section 30 outputs the setting data and the rate signal corresponding to the test pattern in synchronization with the reference clock generated by the clock generating section 12. The logic sections 30 are arranged in parallel and each output a number n of rate signals, also known as n-ways of the rate signal, and the setting data in parallel.

The period delay sections 40 receive the rate signals and setting data output by the logic sections 30. The period delay sections 40 delay each pulse of the rate signals by a delay amount corresponding to a component of an integer multiple of the period of an operation clock supplied thereto, from among the delay amounts indicated by the setting data. The period delay sections 40 delay at least a portion of the setting data by a delay amount that is the same as the delay amount applied to the rate signal.

The period delay sections 40 may each include flip-flops connected in cascade that operate according to the operation clock and a selecting section that adjusts the delay amount by selecting which flip-flop outputs a signal. The period delay sections 40 are arranged in parallel and each output n rate signals and setting data in parallel.

The frequency multiplier 32 outputs an operation clock obtained by multiplying the frequency of the reference clock output from the clock generating section 12 by L. The frequency multiplier 32 may include a PLL circuit that receives the reference clock as a reference signal. The frequency multiplier 32 distributes the operation clock to the period delay sections 40, the mode switching sections 70, and the high-accuracy delay sections 34.

The mode switching sections 70 receive the n rate signals and the setting data output by each period delay section 40. Each mode switching section 70 switches the number m of output signals and the frequency of each output signal, according to a set operational mode. For example, in a low-speed mode, each mode switching section 70 may pass the n rate signals that are received from each period delay section 40, where m=n.

In the high-speed mode, each mode switching section 70 may output m signals, where m is less than the number n of signals input thereto. For example, in the high-speed mode, a mode switching section 70 may output a single rate signal obtained by interleaving two rate signals output respectively by a first period delay section 40 and a second period delay section 40. Similarly, the mode switching section 70 may output one piece of setting data obtained by interleaving the two pieces of setting data output by the first period delay section 40 and the second period delay section 40. The number m of output signals is preferably a divisor of the number n of input signals.

Here, interleaving may be a process of generating a signal in which a plurality of signals are arranged on the same time axis while maintaining the relative positions of the pulses in the signals, by calculating the OR of the signals. Similarly, a high-frequency data signal can be generated by arranging a plurality of data signals on the same time axis while maintaining the relative position of each data value in the data signals. At this time, when adjacent pieces of data overlap on the time axis, the time length of each piece of data is preferably adjusted.

More specifically, by interleaving a signal having pulses at the timings T, 3T, 5T, etc. and a signal having pulses at the timings 2T, 4T, 6T, etc., a high-frequency signal having pulses at the timings T, 2T, 3T, 4T, etc. can be generated. The high-accuracy delay sections 34 delay each pulse of the rate signals output by the mode switching section 70 according to the data values in the setting data output by the mode switching section 70. The high-accuracy delay sections 34 generate delays that are less than the period of the operation clock.

The timing generator 20 preferably includes a number of high-accuracy delay sections 34 in parallel that corresponds to the maximum number n of rate signals output by the mode switching sections 70. In this way, no matter how many rate signals the mode switching sections 70 output, the high-accuracy delay sections 34 can be allocated to each rate signal.

The timing generator 20 applies the test signal to the device under test 200 based on the rate signals output by the high-accuracy delay sections 34. For example, the timing generator 20 may apply these rate signals to the device under test 200 as test signals, or may generate a test signal by inputting two rate signals to a set/reset latch circuit as the set signal and the reset signal.

With the configuration described above, a plurality of types of timing generator 20 with different output frequencies can be realized without changing the hardware. Furthermore, a rate signal can be output having a frequency higher than the frequency at which the logic section 30 and the period delay section 40 can operate.

Yet further, since the rate signals are interleaved at a stage prior to the high-accuracy delay sections 34, the occurrence of jitter in the interleaved rate signal due to element variance of the high-accuracy delay sections 34 can be decreased. Since the setting data is also interleaved, the delay amount of each pulse in a high-frequency rate signal can be controlled.

The judging section 14 judges pass/fail of the device under test 200 based on the operation of the device under test 200 to which the test signal is applied. For example, the judging section 14 may judge pass/fail of the device under test 200 based on whether the logic pattern of the response signal output by the device under test 200 matches a prescribed expected value pattern. As another example, the judging section 14 may judge the acceptability of the device under test 200 based on voltage or current applied to the device under test 200.

Figure 2:
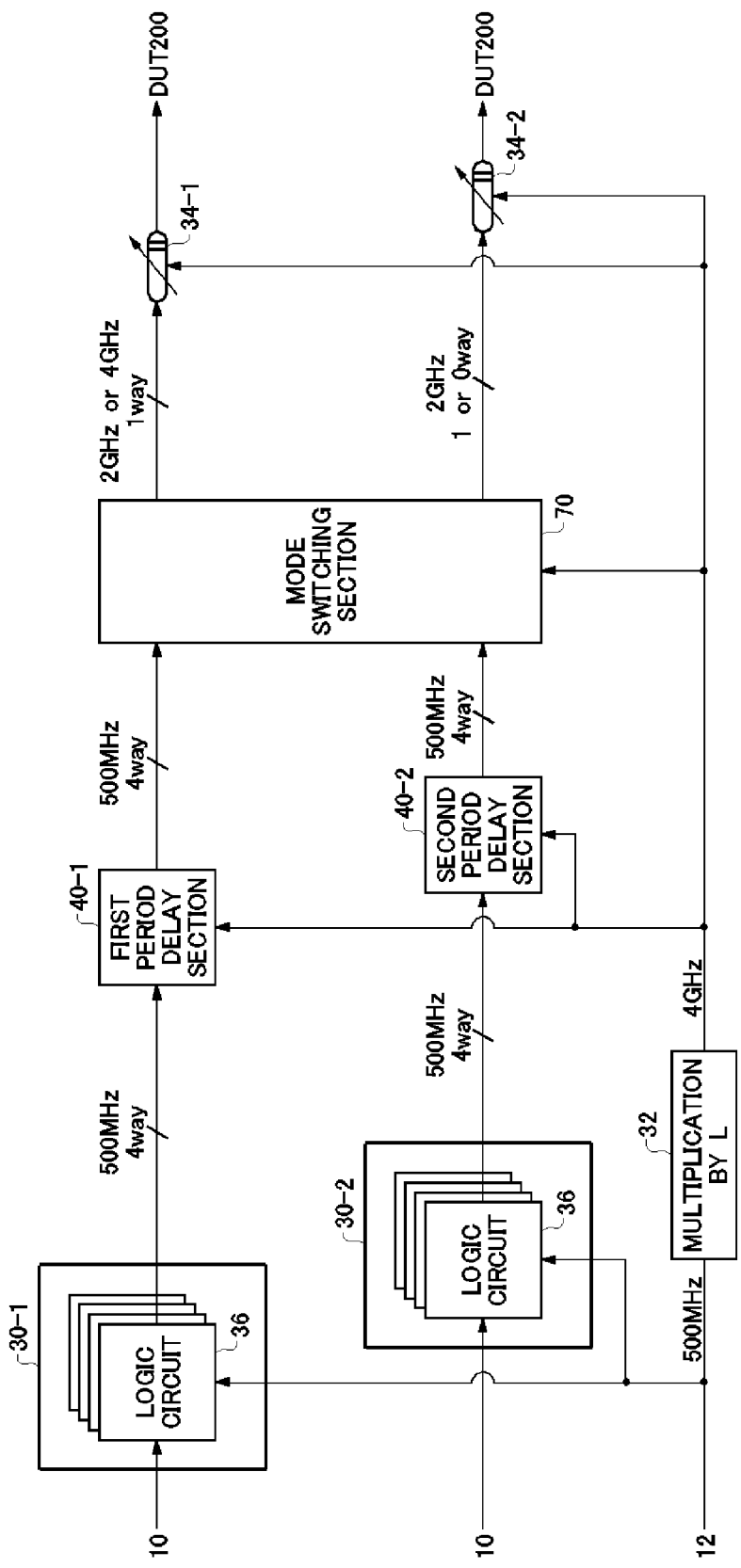
FIG. 2 is a view for describing the basics of the timing generator 20.

FIG. 2 is a view for describing the basics of the timing generator 20. In this example, the number n of signals described in relation to FIG. 1 is 8. Furthermore, m=2 in the low-speed mode, which means that two rate signals are output, and m=1 in the high-speed mode, which means that one rate signal is output. The frequency of the reference clock supplied from the clock generating section 12 to the timing generator 20 is 500 MHz. The frequency multiplier 32 outputs an operation clock of 4 GHz obtained by multiplying the reference clock by 8.

The timing generator 20 in the present example includes two logic sections 30, two period delay sections 40, a mode switching section 70, a frequency multiplier 32, and two high-accuracy delay section 34. Each logic section 30 includes four logic circuits 36. Each logic circuit 36 outputs one set of a rate signal and setting data in synchronization with the reference clock. In other words, each logic section 30 outputs four sets of a 500 MHz (500 Mbps) rate signal and setting data.

The first period delay section 40-1 receives the four sets of a rate signal and setting data output by the first logic section 30-1. The second period delay section 40-2 receives the four sets of a rate signal and setting data output by the second logic section 30-2. Each period delay section 40 delays each rate signal according to the corresponding setting data.

As described above, each period delay section 40 generates a component of an integer multiple of the operation clock, from among the delay amounts indicated by the setting data. In other words, each period delay section 40 delays the corresponding rate signals with a resolution of 250 ps. As a result, the first period delay section 40-1 and the second period delay section 40-2 each output four sets of a 500 MHz rate signal and setting data in which the phases of the pulses and data are adjusted with a resolution of 250 ps.

The mode switching section 70 receives the eight sets of a rate signal and setting data output by the first period delay section 40-1 and the second period delay section 40-2, and outputs one or two rate signals. The mode switching section 70 switches whether a 2 GHz rate signal generated from only the rate signal output by the first period delay section 40-1 is input to the first high-accuracy delay section 34-1 or a 4 GHz rate signal generated by interleaving the rate signals output by the first period delay section 40-1 and the second period delay section 40-2 is input to the first high-accuracy delay section 34-1.

In the low-speed mode, for example, the mode switching section 70 converts each set of four rate signals received from the period delay sections 40 into one rate signal. The mode switching section 70 may include a serializer that converts each set of four rate signals received in parallel into one serial signal, or may include an OR circuit that outputs an OR of each set of four rate signals. In this way, two 2 GHz rate signals can be generated.

In the low-speed mode, the mode switching section 70 inputs, to the first high-accuracy delay section 34-1, the 2 GHz rate signal generated from the rate signals output by the first period delay section 40-1. Furthermore, the mode switching section 70 inputs, to the second high-accuracy delay section 34-2, the 2 GHz rate signal generated from the rate signal output by the second period delay section 40-2.

In the high-speed mode, the mode switching section 70 converts the eight rate signals received from the two period delay sections 40 into one rate signal. In this way, the mode switching section 70 can generate one 4 GHz rate signal. The mode switching section 70 inputs the 4 GHz rate signal to the first high-accuracy delay section 34-1. At this time, the mode switching section 70 need not input a rate signal to the second high-accuracy delay section 34-2. As another example, the mode switching section 70 may distribute the same signal to both the first high-accuracy delay section 34-1 and the second high-accuracy delay section 34-2.

The mode switching section 70 performs the same process on the setting data that was performed on the rate signal. In this way, when operating in the low-speed mode, the mode switching section 70 controls the delay amount of the first high-accuracy delay section 34-1 according to the setting data output by the first period delay section 40-1 and controls the delay amount of the second high-accuracy delay section 34-2 according to the setting data output by the second period delay section 40-1.

When operating in the high-speed mode, the mode switching section 70 controls the delay amount of the first high-accuracy delay section 34-1 according to data obtained by interleaving the setting data output by the first period delay section 40-1 and the setting data output by the second period delay section 40-2. At this time, the second high-accuracy delay section 34-2 need not be supplied with the setting data.

The first high-accuracy delay section 34-1 and the second high-accuracy delay section 34-2 delay each pulse in the rate signals supplied from the mode switching section 70, according to each data value of the corresponding setting data. In this way, rate signals with a variety of frequencies can be generated using the same circuit configuration.

Figure 3:
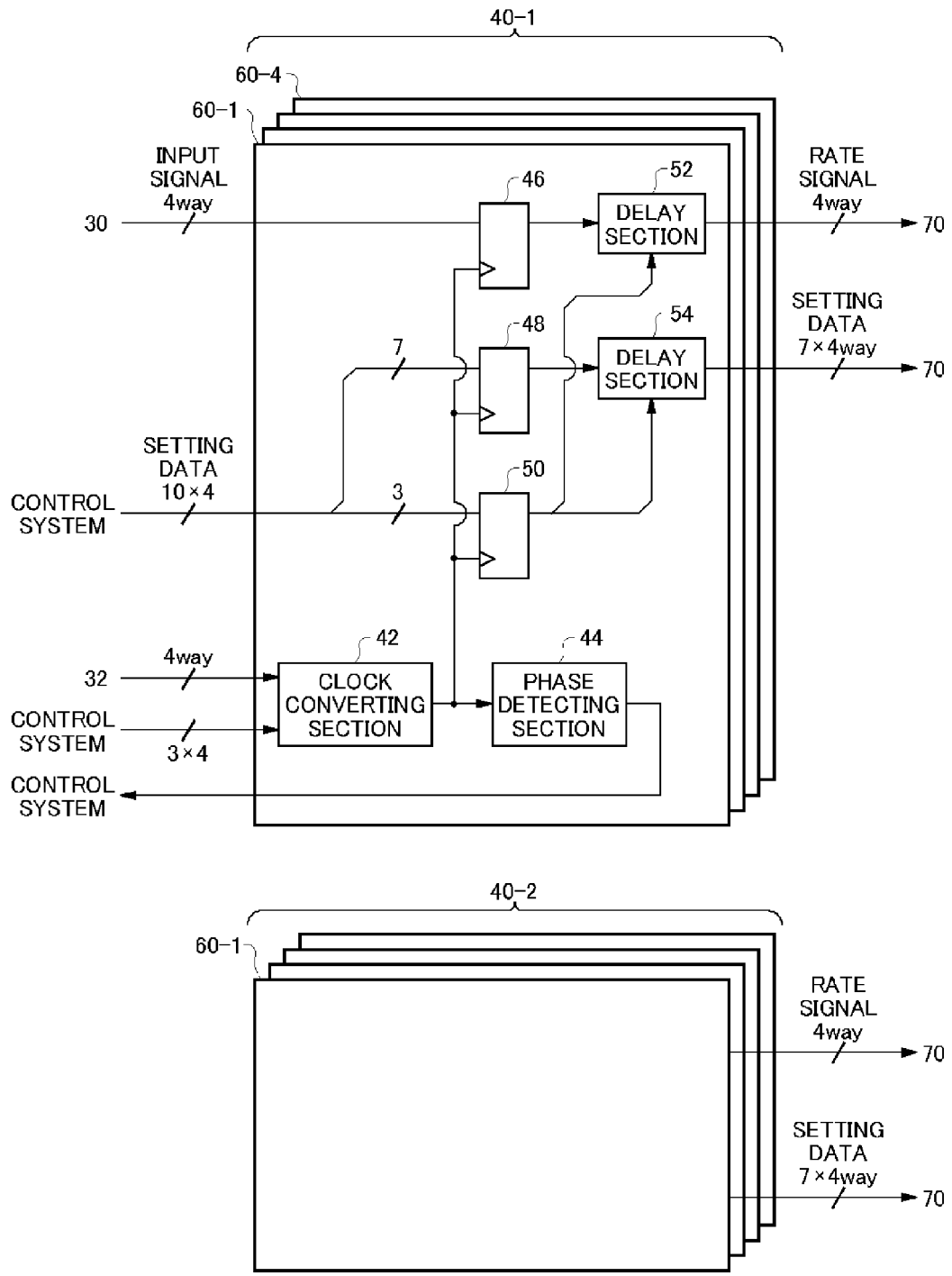
FIG. 3 shows an exemplary configuration of a period delay section 40.

FIG. 3 shows an exemplary configuration of a period delay section 40. FIG. 3 shows the configuration of the first period delay section 40-1, but each period delay section 40 has the same configuration. The period delay section 40 includes a plurality of circuit modules 60 corresponding to the number of input signals, which are rate signals in the present embodiment, received from the logic section 30. In this example, each period delay section 40 includes four circuit modules 60. Each circuit module 60 outputs a rate signal obtained by delaying the corresponding input signal.

The circuit module 60 includes a clock converting section 42, a phase detecting section 44, a signal retiming circuit 46, a lower retiming circuit 48, an upper retiming circuit 50, a signal delay circuit 52, and a data delay section 54. The clock converting section 42 receives the operation clock from the frequency multiplier 32, and generates the frequency-divided clock by dividing the operation clock by L. In other words, the clock converting section 42 generates a frequency-divided clock having the same frequency as the reference clock generated by the clock generating section 12.

The phase detecting section 44 controls the phase of the frequency-divided clock generated by the clock converting section 42 such that the edge timing of the frequency-divided clock is arranged substantially in the center of the eye opening supplied from the logic section 30. For example, the phase detecting section 44 of the present embodiment detects the phase difference between the setting data and the frequency-divided clock, and notifies a control system (not shown) of the test apparatus 100 concerning the phase difference. The control system controls the phase of the frequency-divided clock output by the clock converting section 42 such that the phase difference indicated in the notification to the phase detecting section 44 becomes a prescribed value.

The signal retiming circuit 46 retimes the input signal received from the logic section 30 using the frequency-divided clock. The lower retiming circuit 48 receives a prescribed number of lower bits, e.g. the lowest seven bits, among the setting data, which may have ten bits, received from the logic section 30, and retimes the received lower bits using the frequency-divided clock.

The upper retiming circuit 50 receives a prescribed number of upper bits, e.g. the highest three bits, among the setting data received from the logic section 30, and retimes the received upper bits using the frequency-divided clock. Each retiming circuit may be a flip-flop that operates according to the frequency-divided clock.

The signal delay circuit 52 delays the rate signal retimed by the signal retiming circuit 46, according to the upper bits of the setting data output from the upper retiming circuit 50. The data delay section 54 delays the lower bits of the setting data retimed by the lower retiming circuit 48, according to the upper bits of the setting data output by the upper retiming circuit 50.

The signal delay circuit 52 and the data delay section 54 may each delay the signal by a delay amount obtained as the product of the period of the operation clock and a number designated by the upper bits of the setting data. With this configuration, each circuit module 60 outputs a rate signal and 7-bit setting data indicating the delay amount to be applied to the rate signal by the high-accuracy delay section 34. The period delay section 40 of the present embodiment includes four circuit modules 60, and therefore outputs four sets of a rate signal and setting data.

Figure 4:
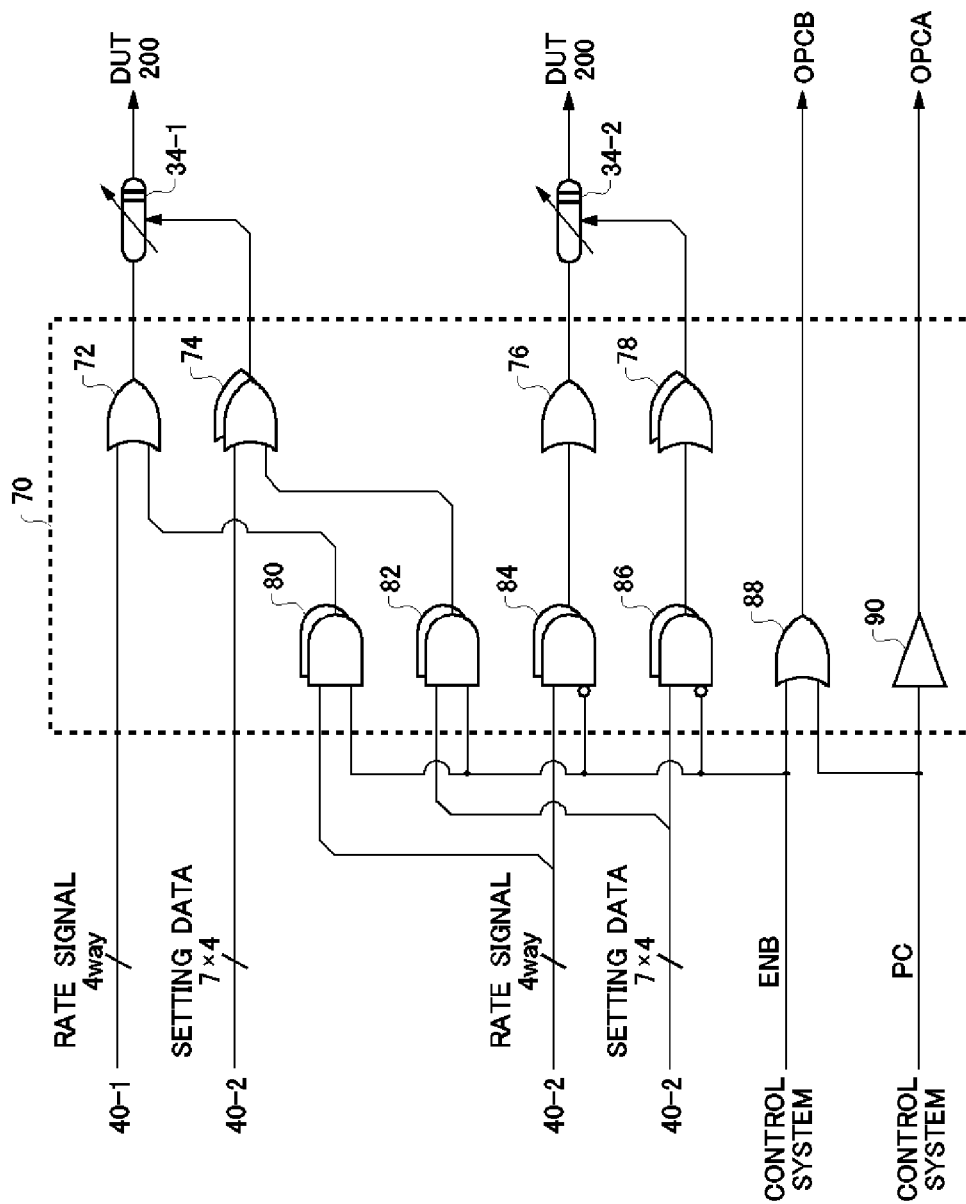
FIG. 4 shows the configuration of the mode switching section 70, along with the high-accuracy delay sections 34.

FIG. 4 shows the configuration of the mode switching section 70, along with the high-accuracy delay sections 34. The mode switching section 70 of the present embodiment includes a first multi-input OR circuit 72, a first data interleaving section 74, a second multi-input OR circuit 76, a second data interleaving section 78, a signal bypass section 80, a data bypass section 82, a signal passing section 84, a data passing section 86, a first power control section 90, and a second power control section 88.

The mode switching section 70 of the present embodiment is supplied with a power control signal PC and a mode selection signal ENB from the control system of the test apparatus 100. The low-speed mode may be indicated by ENB=0 and the high-speed mode may be indicated by ENB=1, for example.

In the high-speed mode, the signal bypass section 80 inputs the rate signal output by the second period delay section 40-2 as-is to the first multi-input OR circuit 72. When operating in the low-speed mode, the signal bypass section 80 does not input the rate signal output by the second period delay section 40-2 into the first multi-input OR circuit 72.

When operating in the high-speed mode, the data bypass section 82 inputs the setting data output by the second period delay section 40-2 as-is to the first data interleaving section 74. When operating in the low-speed mode, the data bypass section 82 does not input the setting data output by the second period delay section 40-2 to the first data interleaving section 74.

The first multi-input OR circuit 72 outputs a signal obtained by interleaving the input signals, e.g. a signal that is an OR of the input signals. In the low-speed mode, the first multi-input OR circuit 72 of the present embodiment receives only the rate signal output by the first period delay section 40-1. In the high-speed mode, the multi-input OR circuit 72 of the present embodiment receives the rate signal output by the second period delay section 40-2, via the signal bypass section 80, in addition to the rate signal output by the first period delay section 40-1. As a result, the first multi-input OR circuit 72 inputs a rate signal having a frequency corresponding to the operational mode to the first high-accuracy delay section 34-1.

The first data interleaving section 74 interleaves the setting data input thereto and outputs the result. Here, interleaving may be a process of generating the OR of the setting data input thereto. In the low-speed mode, the first multi-input OR circuit 72 of the present embodiment receives only the setting data output by the first period delay section 40-1. In the high-speed mode, the multi-input OR circuit 72 of the present embodiment receives the setting data output by the second period delay section 40-2, via the data bypass section 82, in addition to the setting data output by the first period delay section 40-1. As a result, the first data interleaving section 74 controls the delay amount of the first high-accuracy delay section 34-1 with a frequency corresponding to the operational mode.

The second multi-input OR circuit 76 outputs a signal obtained by interleaving the input signals, e.g. a signal that is an OR of the input signals. In the low-speed mode, the second multi-input OR circuit 76 of the present embodiment receives the rate signal output by the second period delay section 40-2, via the signal passing section 84. In the high-speed mode, the signal passing section 84 prevents the rate signal from being input to the second multi-input OR circuit 76. As a result, the second multi-input OR circuit 76 switches whether a rate signal is input to the second high-accuracy delay section 34-2, according to the operational mode.

The second data interleaving section 78 interleaves the setting data input thereto and outputs the result. In the low-speed mode, the second data interleaving section 78 of the present embodiment receives the setting data output by the second period delay section 40-2, via the data passing section 86. In the high-speed mode, the data passing section 86 prevents the setting data from being input to the second data interleaving section 78. As a result, the second data interleaving section 78 switches whether the delay amount of the second high-accuracy delay section 34-2 is controlled, according to the operational mode.

The first power control section 90 outputs an output power control signal OPCA based on the power control signal PC to switch whether power is supplied to the first high-accuracy delay section 34-1. For example, the first power control section 90 may stop the supply of power to the first high-accuracy delay section 34-1 when the power control signal PC has a logic value of 1.

The second power control section 88 outputs an output power control signal OPCB based on the mode selection signal ENB and the power control signal PC to switch whether power is supplied to the second high-accuracy delay section 34-2. For example, the second power control section 88 may stop the supply of power to the second period delay section 34-2 when one of the power control signal PC and the mode selection signal ENB has a logic value of 1.

With the above configuration, a rate signal having a frequency corresponding to the operational mode can be generated. Furthermore, in the high-speed mode, the supply of power to the second high-accuracy delay section 34-2, which is not operating, is stopped, and therefore the power consumption is reduced.

Figure 5:
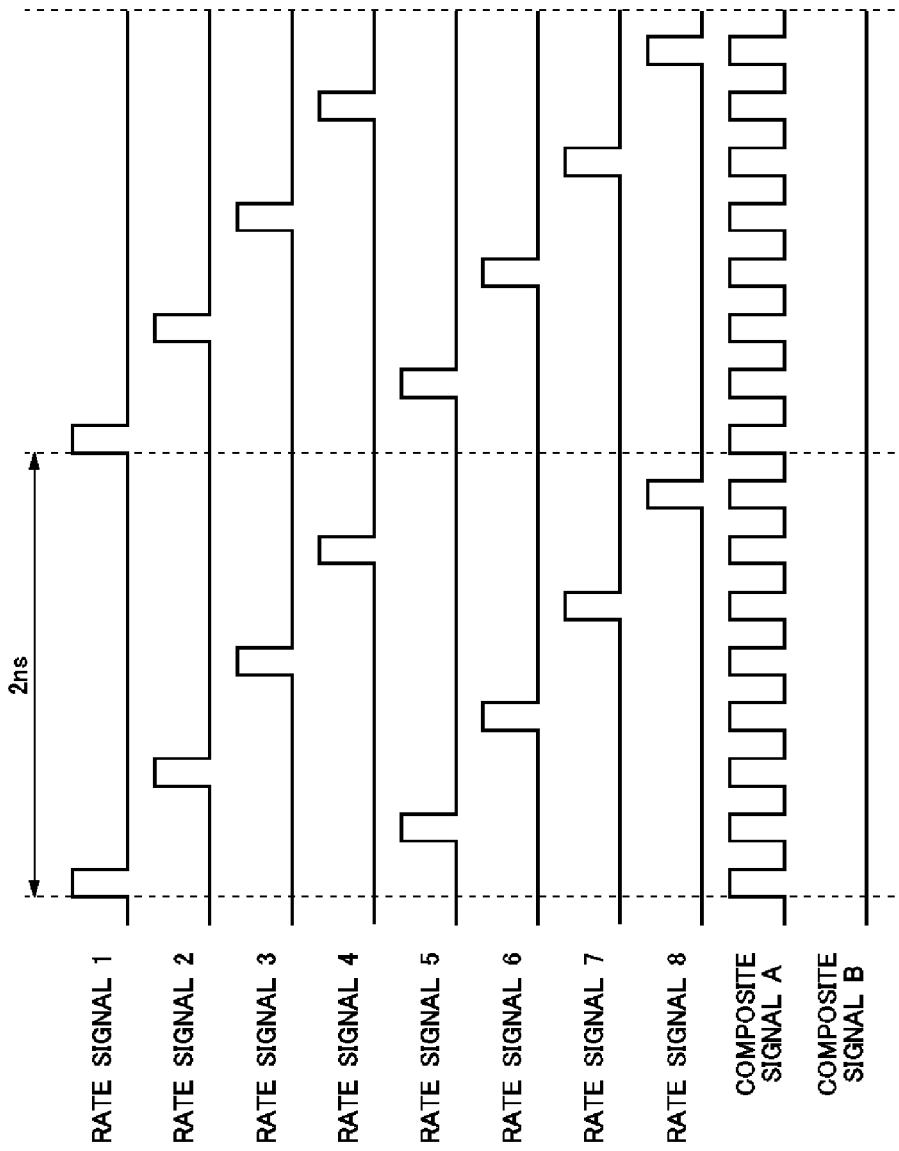
FIG. 5 is a timing chart showing an exemplary operation of the timing generator 20.

FIG. 5 is a timing chart showing an exemplary operation of the timing generator 20. This example describes the operation of the timing generator 20 in the high-speed mode. In the following example, the generated rate signals each have pulses arranged at substantially uniform intervals.

Rate signals 1 to 4 in FIG. 5 indicate the rate signals output by the first period delay section 40-1, and rate signals 5 to 8 indicate the rate signals output by the second period delay section 40-2. Composite signal A indicates the signal input to the first high-accuracy delay section 34-1, and composite signal B indicates the signal input to the second high-accuracy delay section 34-2.

In the high-speed mode, as shown in FIG. 5, the first period delay section 40-1 and the second period delay section 40-2 generate rate signals having pulses at different timings from each other. Each rate signal has the same period as the reference clock.

The first period delay section 40-1 and the second period delay section 40-2 each set the pulse timings of the rate signals such that the rate signals respectively have pulses at timings obtained by dividing the period of the reference clock, which is 2 ns, by the number of rate signals, which is 8. These pulse timings can be adjusted by the period delay sections 40 delaying the rate signals by an integer multiple of the period of the operation clock, which is a clock obtained by multiplying the reference clock by 8.

The mode switching section 70 generates the high-frequency composite signal A by generating the OR of the eight rate signals, and inputs the composite signal A to the first high-accuracy delay section 34-1. The mode switching section 70 need not generate the composite signal B.

Figure 6:
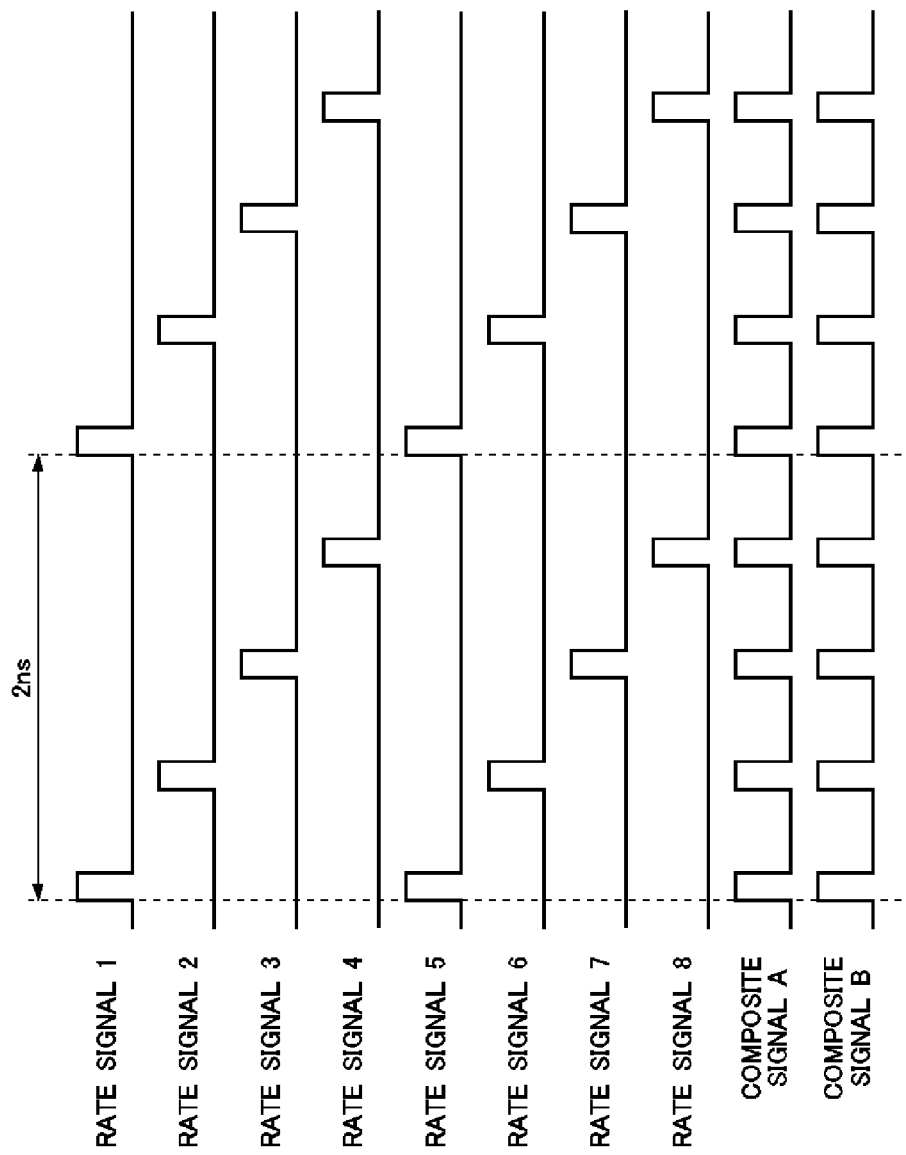
FIG. 6 is a timing chart showing an exemplary operation of the timing generator 20.

FIG. 6 is a timing chart showing an exemplary operation of the timing generator 20. This example describes the operation of the timing generator 20 in the low-speed mode. In the low-speed mode, the first period delay section 40-1 and the second period delay section 40-2 may generate the rate signals independently of each other. In other words, as shown in FIG. 6, the first period delay section 40-1 and the second period delay section 40-2 may generate rate signals having pulses at the same timings.

Each period delay section 40 sets the pulse timing of each rate signal such that the rate signals respectively have pulses at timings obtained by dividing the period of the reference clock, which is 2 ns, by the number of rate signals output by the period delay section 40 itself, which is 4. The mode switching section 70 generates the composite signal A based on the OR of rate signals 1 to 4 and generates the composite signal B based on the OR of rate signals 5 to 8.

Figure 7:
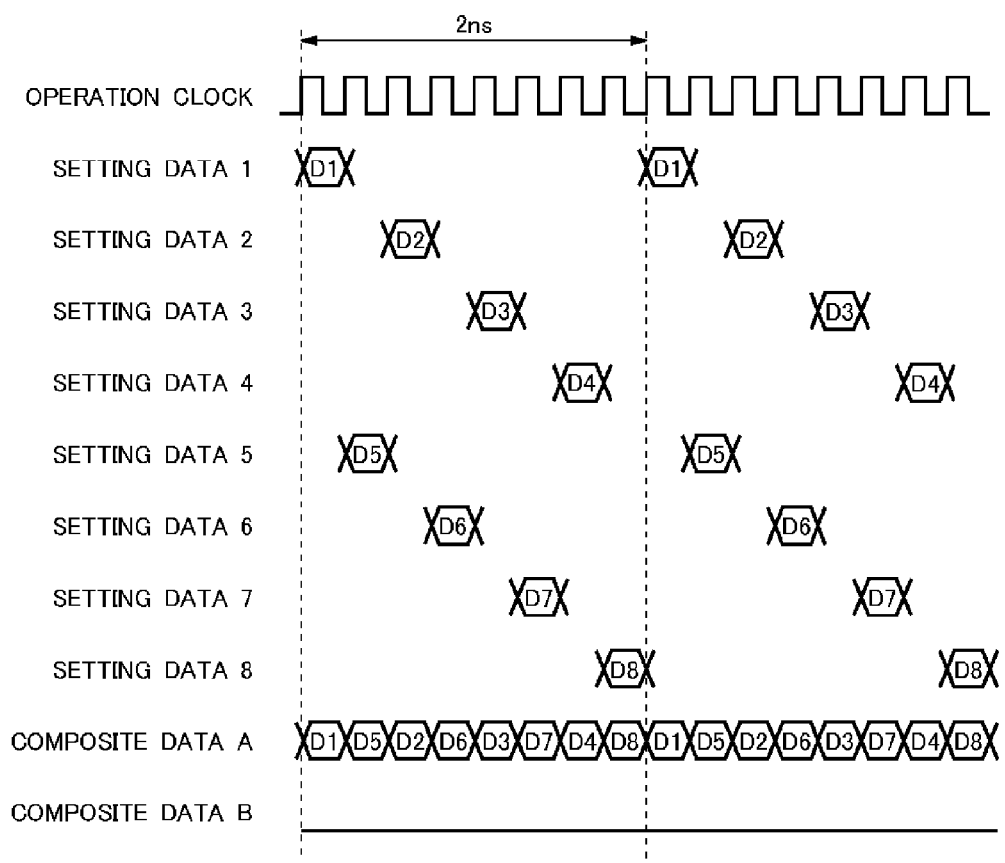
FIG. 7 is a timing chart showing exemplary operations of the first data interleaving section 74 and the second data interleaving section 78.

FIG. 7 is a timing chart showing exemplary operations of the first data interleaving section 74 and the second data interleaving section 78. This example describes exemplary operations performed in the high-speed mode. In FIG. 7, the pieces of setting data 1 to 4 indicate the setting data output by the first period delay section 40-1, and the pieces of setting data 5 to 8 indicate the setting data output by the second period delay section 40-2. Each period delay section 40 outputs each piece of setting data in synchronization with the corresponding rate signal. Each data delay section 54 outputs the setting data with a period substantially equal to the period of the operation clock, which is 250 ps in this example. The setting data of this example is synchronized with the rate signals shown in FIG. 5.

Furthermore, composite data A indicates the data for controlling the delay amount of the first high-accuracy delay section 34-1, and composite data B indicates the data for controlling the delay amount of the second high-accuracy delay section 34-2. In the high-speed mode, the first data interleaving section 74 receives the pieces of setting data 1 to 8.

As described above, the first data interleaving section 74 outputs the OR of the setting data. Each data delay section 54 delays the corresponding piece of setting data by a delay amount corresponding to the upper bits received from the logic section 30, and therefore the first data interleaving section 74 outputs each piece of setting data in an order corresponding to the value of the upper bits in each piece of setting data. As a result, the composite data A can be generated in synchronization with the composite signal A having a relatively high frequency. The second data interleaving section 78 does not receive setting data, and therefore does not generate the composite data B.

Figure 8:
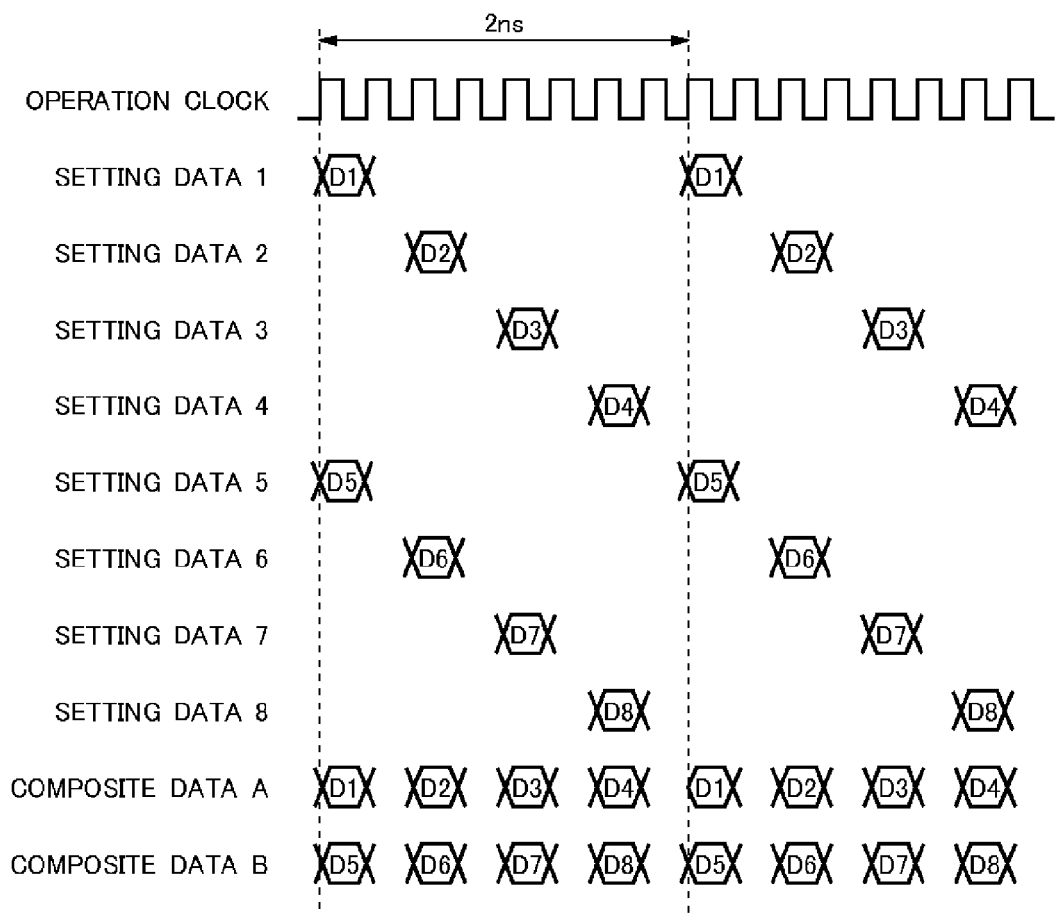
FIG. 8 is a timing chart showing exemplary operations of the first data interleaving section 74 and the second data interleaving section 78.

FIG. 8 is a timing chart showing exemplary operations of the first data interleaving section 74 and the second data interleaving section 78. This example describes exemplary operations performed in the low-speed mode. In this example, the pieces of setting data are synchronized with the rate signals shown in FIG. 6.

In the low-speed mode, the first data interleaving section 74 receives the pieces of setting data 1 to 4 and the second data interleaving section 78 receives the pieces of setting data 5 to 8. In this way, the composite data A and the composite data B can be generated in synchronization with two composite signals having relatively low frequencies.

Figure 9:
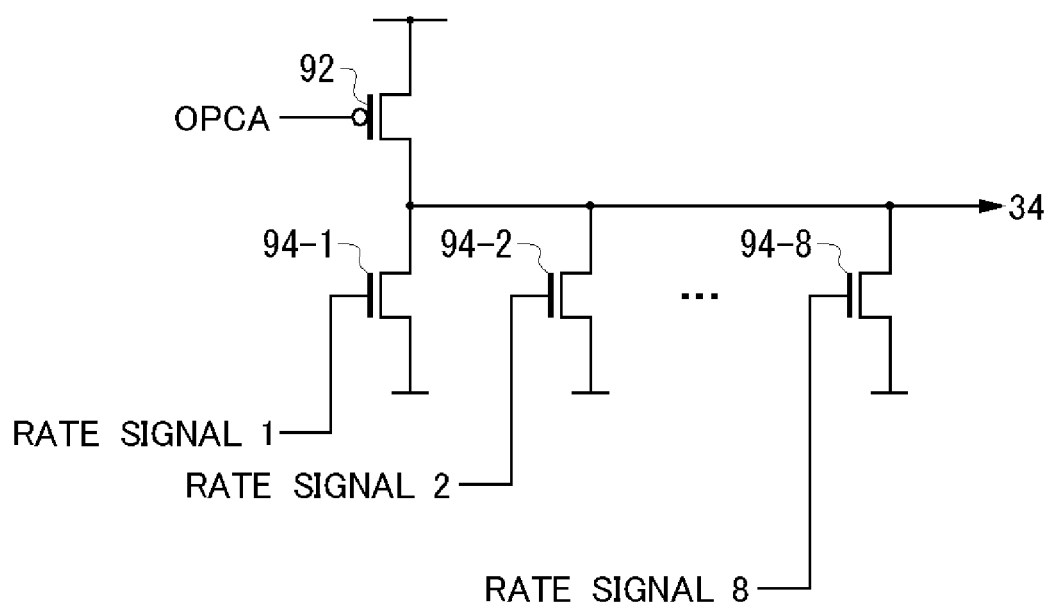
FIG. 9 shows an exemplary configuration of the first multi-input OR circuit 72.

FIG. 9 shows an exemplary configuration of the first multi-input OR circuit 72. The second multi-input OR circuit 76 has the same configuration as the first multi-input OR circuit 72. The first multi-input OR circuit 72 includes a P-channel transistor 92 and a plurality of N-channel transistors 94.

The P-channel transistor 92 is connected between the plurality of N-channel transistors 94 and a high-voltage power supply line. The P-channel transistor 92 is turned ON when the supply power is supplied to the first high-accuracy delay section 34-1, such that current flows from the high-voltage power supply line to the N-channel transistors 94. The P-channel transistor 92 is turned OFF when the supply power is not supplied to the first high-accuracy delay section 34-1, such that current does not flow from the high-voltage power supply line to the N-channel transistors 94.

The N-channel transistors 94 are connected in parallel between the P-channel transistor 92 and a low-voltage power supply line. The number of N-channel transistors 94 provided corresponds to the number of rate signals input to the multi-input OR circuit 72. Each N-channel transistor 94 is turned ON when the corresponding rate signal is logic H, and is turned OFF when the corresponding rate signal is logic L.

The first multi-input OR circuit 72 outputs, to the first high-accuracy delay section 34-1, the potential at the connection point between the P-channel transistor 92 and the N-channel transistors 94. With this configuration, the OR of a plurality of rate signals can be generated. Each rate signal passes through only one transistor, regardless of the number of input rate signals. Therefore, the first multi-input OR circuit 72 can be made to operate using a low-voltage power supply.

Figure 10:
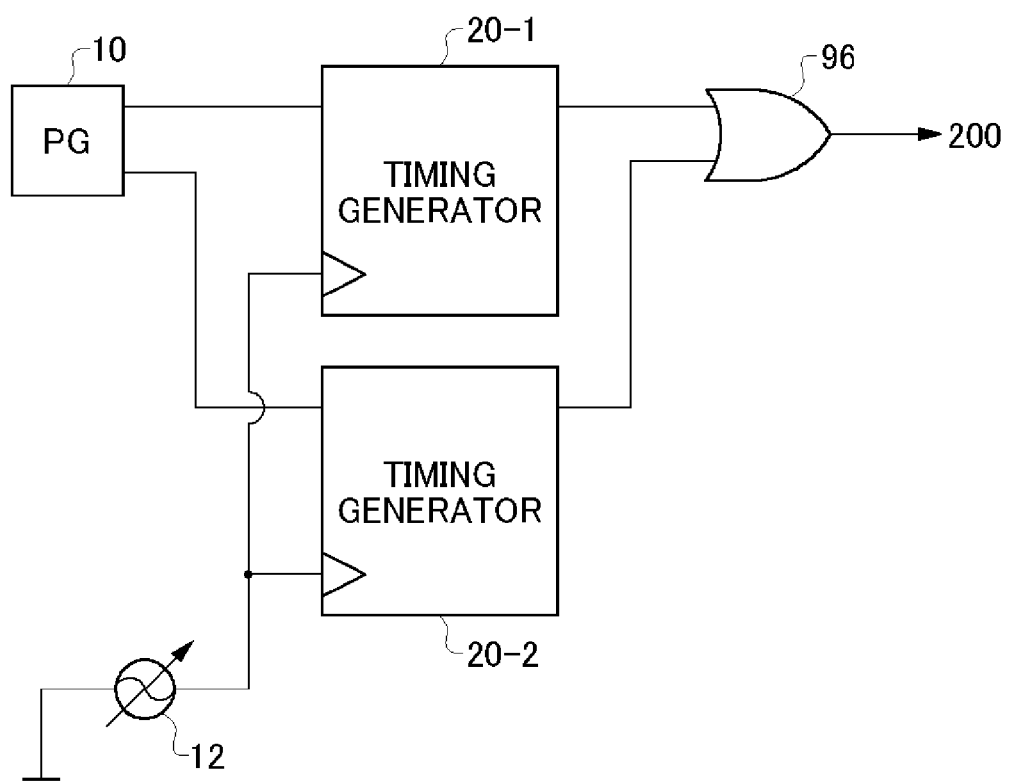
FIG. 10 shows another exemplary configuration of the test apparatus 100.

FIG. 10 shows another exemplary configuration of the test apparatus 100. In FIG. 10, the judging section 14 is not shown. The test apparatus 100 of the present embodiment includes the pattern generator 10, the clock generating section 12, a first timing generator 20-1, a second timing generator 20-2, and an OR circuit 96. The first timing generator 20-1 and the second timing generator 20-2 respectively output rate signals having pulses at different timings.

The OR circuit 96 outputs the OR of the rate signals output by the first timing generator 20-1 and the second timing generator 20-2. In this way, a rate signal can be generated having twice the frequency of the rate signal generated by the test apparatus 100 using one timing generator 20.

Furthermore, the clock generating section 12 may change the frequency of the reference clock. For example, the clock generating section 12 may be able to output one of a 500 MHz reference clock and a 250 MHz reference clock.

The test apparatus 100 may control the frequency of the reference clock of the clock generating section 12, the operational modes of the timing generators 20, and the whether the timing generators 20 output the OR, in combination with each other. In this way, the test apparatus 100 can generate a variety of combinations of frequencies and number of the rate signals.

Figure 11:
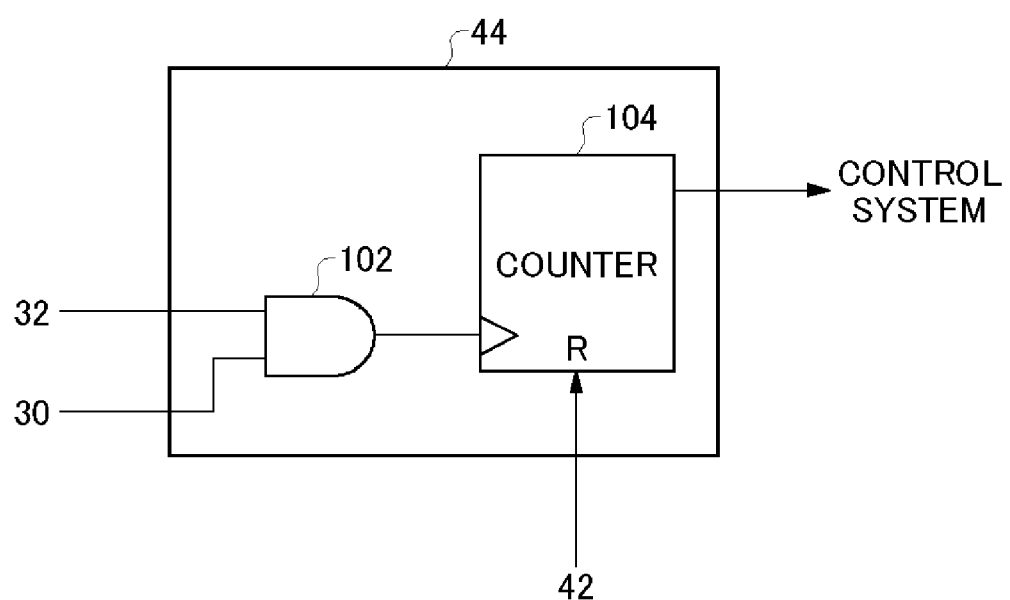
FIG. 11 shows an exemplary configuration of a phase detecting section 44.

FIG. 11 shows an exemplary configuration of a phase detecting section 44. The phase detecting section 44 measures the phase difference between a pulse of the frequency-divided clock and the falling edge of the rate signal received from the logic section 30, by counting the number of pulses of the operation clock from when the pulse of the frequency-divided clock is detected to when the falling edge is detected. The phase detecting section 44 of the present embodiment includes an AND circuit 102 and a counter 104.

Figure 12:
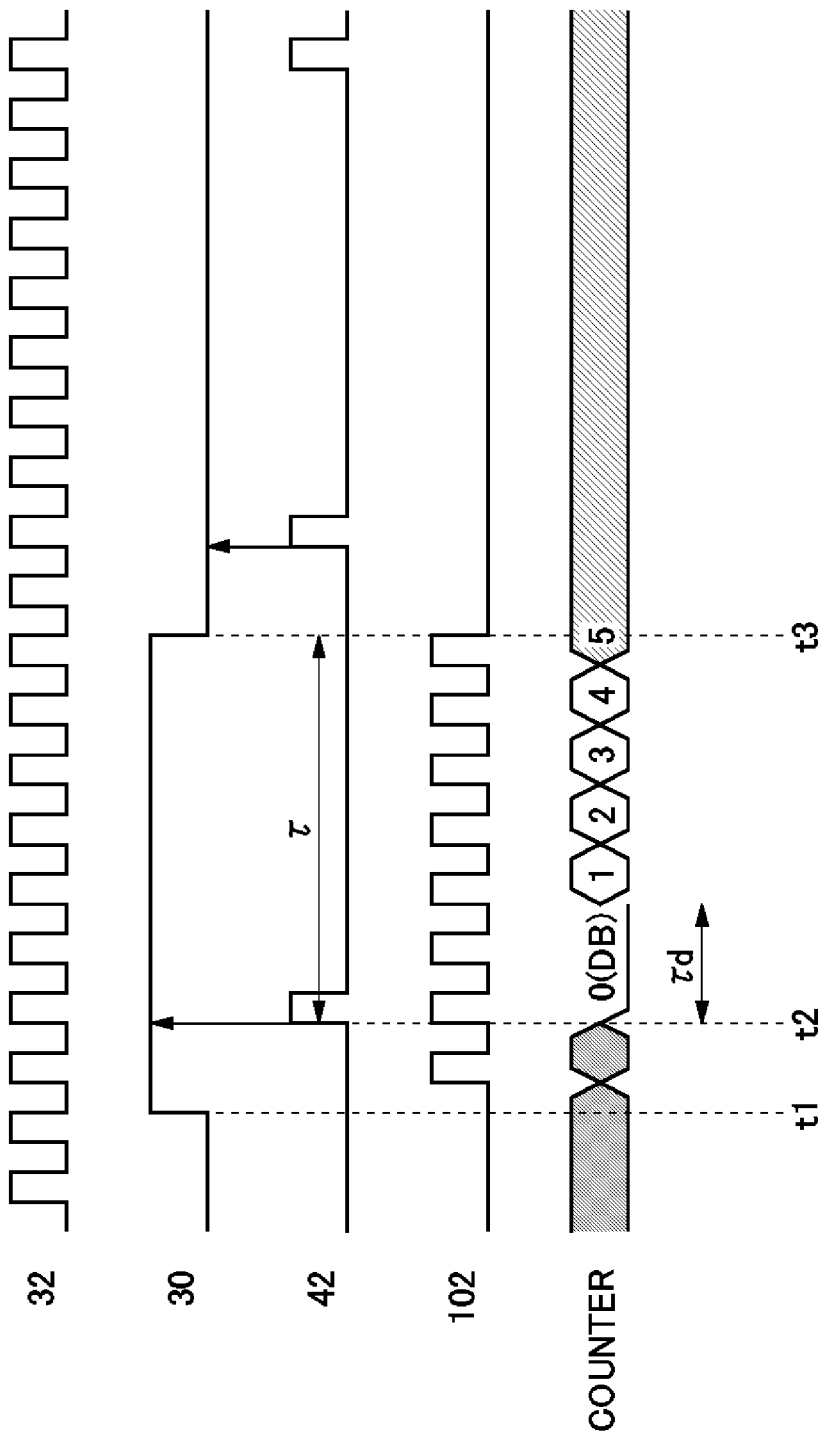
FIG. 12 shows an exemplary operation of the phase detecting section 44.

FIG. 12 shows an exemplary operation of the phase detecting section 44. The AND circuit 102 supplies the counter 104 with the AND of the operation clock output by the frequency multiplier 32 and the rate signal output by the logic section 30. In other words, the AND circuit 102 supplies the operation clock to the counter 104 while the rate signal is logic H.

The counter 104 receives the clock from the AND circuit 102 at a clock terminal thereof, and counts the pulses of the clock. The counter 104 receives the frequency-divided clock from the clock converting section 42 at the input terminal thereof, and for each pulse of the frequency-divided clock, resets the count value. In this way, the counter 104 outputs a count value corresponding to the phase difference between a pulse of the frequency-divided clock and the falling edge of the rate signal received from the logic section 30.

The control system of the test apparatus 100 adjusts the phase of the frequency-divided clock output by the clock converting section 42, such that the count value becomes a prescribed value. In this way, the phase of the frequency-divided clock can be set to be substantially in the center of the data interval of the rate signal and the setting data.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A timing generator that outputs a timing signal, comprising:
    a logic section operable to receive a reference clock and output, in synchronization with the reference clock, setting data indicating one or more delay amounts and a plurality of rate signals;
    a first period delay section and a second period delay section each operable to receive setting data and a rate signal from among the setting data and the plurality of rate signals output by the logic section, output a delayed rate signal obtained by delaying the received rate signal by a delay amount, from among the one or more delay amounts indicated by the received setting data, corresponding to an integer multiple of a period of an operation clock supplied thereto, and output the setting data in synchronization with the delayed rate signal;
    a first high-accuracy delay section operable to delay a signal input thereto by a delay amount, indicated by the setting data, that is less than the period of the operation clock and output the resulting delayed signal as the timing signal; and
    a mode switching section operable to switch between a low-speed mode, in which the delayed rate signal output by the first period delay section is input to the first high-accuracy delay section as the signal input thereto, and a high-speed mode, in which a signal obtained by interleaving the delayed rate signal output by the first period delay section and the delayed rate signal output by the second period delay section is input to the first high-accuracy delay section as the signal input thereto.

2. The timing generator according to claim 1, further comprising a second high-accuracy delay section operable to delay a signal input thereto by a delay amount, indicated by the setting data, that is less than the period of the operation clock and output the resulting delayed signal as a second timing signal, wherein
    the mode switching section inputs the delayed rate signal output by the second period delay section to the second high-accuracy delay section as the signal input thereto when operating in the low-speed mode, and does not input a rate signal to the second high-accuracy delay section when operating in the high-speed mode.

3. The timing generator according to claim 2, wherein
    the mode switching section controls the delay amount of the first high-accuracy delay section according to the delayed setting data output by the first period delay section when operating in the low-speed mode, and controls the delay amount of the first high-accuracy delay section according to data obtained by interleaving the delayed setting data output by the first period delay section and the delayed setting data output by the second period delay section when operating in the high-speed mode.

4. The timing generator according to claim 3, wherein
    the mode switching section stops a supply of supply power to the second high-accuracy delay section when operating in the high-speed mode.

5. The timing generator according to claim 1, wherein
    the first period delay section and the second period delay section each output a plurality of the delayed rate signals,
    the mode switching section includes a multi-input OR circuit that interleaves two of the delayed rate signals by outputting an OR of one of the delayed rate signals output by the first period delay section and one of the delayed rate signals output by the second period delay section,
    the multi-input OR circuit includes a plurality of N-channel transistors provided in parallel and corresponding respectively to delayed rate signals from among the delayed rate signals output by the first period delay section and the delayed rate signals output by the second period delay section and a P-channel transistor that is connected between a high-voltage power supply line and the plurality of N-channel transistors, and
    the multi-input OR circuit outputs a potential at a connection point between the P-channel transistor and the N-channel transistors.

6. A test apparatus that tests a device under test, comprising:
    a pattern generator that generates a test pattern;
    the timing generator according to claim 1 that applies the test pattern to the device under test at a predetermined timing; and
    a judging section that judges pass/fail of the device under test based on operation of the device under test to which the test pattern is applied.

7. The timing generator according to claim 1, wherein
    the first period delay section and the second period delay section each delay at least a portion of the setting data by a delay amount that is the same as the delay amount by which the received rate signal is delayed.

8. The timing generator according to claim 1, wherein
the logic section outputs n rate signals and the setting data in parallel, where n is an integer greater than one,
the first period delay section and the second period delay section each output n delayed rate signals and the setting data in parallel,
the mode switching section changes a number m according to whether the mode switching section operates in the low-speed mode or the high-speed mode, where m is an integer greater than or equal to one, and outputs m signals, and
the signal input to the first high-accuracy delay section is one of the m signals output by the mode switching section.

9. The timing generator according to claim 8, wherein
in the low-speed mode, m=n, and
in the high-speed mode, m is less than n.

10. The timing generator according to claim 9, wherein
in the high-speed mode, m is a divisor of n.

11. The timing generator according to claim 1, wherein
the logic section includes a first logic section connected to the first period delay section and a second logic section connected to the second period delay section.

12. The timing generator according to claim 1, further comprising
a frequency multiplier operable to multiply the frequency of the reference clock and output the resulting clock as the operation clock.

13. The timing generator according to claim 12, wherein
the frequency multiplier distributes the operation clock to the first period delay section, the second period delay section, the mode switching section, and the first high-accuracy delay section.

* * * * *